United States Patent
Geairon et al.

(10) Patent No.: US 8,965,305 B2
(45) Date of Patent: Feb. 24, 2015

(54) INPUT INTERFACE FOR A TRANSMIT/RECEIVE STATION AND STATION COMPRISING SAME

(75) Inventors: Sébastien Geairon, Cholet Cedex (FR); Franck Trecul, Cholet Cedex (FR); Pierre Saint-Ellier, Cholet Cedex (FR)

(73) Assignee: Thales, Neuilly sur Seine (FR)

( * ) Notice: Subject to any disclaimer, the term of this patent is extended or adjusted under 35 U.S.C. 154(b) by 0 days.

(21) Appl. No.: 13/993,420

(22) PCT Filed: Dec. 13, 2011

(86) PCT No.: PCT/EP2011/072547
§ 371 (c)(1),
(2), (4) Date: Aug. 21, 2013

(87) PCT Pub. No.: WO2012/080212
PCT Pub. Date: Jun. 21, 2012

(65) Prior Publication Data
US 2013/0321058 A1   Dec. 5, 2013

(30) Foreign Application Priority Data
Dec. 13, 2010   (FR) ...................... 10 04845

(51) Int. Cl.
*H04B 1/40* (2006.01)
*H03K 5/00* (2006.01)
*G06F 13/38* (2006.01)

(52) U.S. Cl.
CPC ............... *H03K 5/00* (2013.01); *G06F 13/387* (2013.01)

USPC .............................................. 455/84; 455/557

(58) Field of Classification Search
USPC ............................................. 455/82, 84, 557
See application file for complete search history.

(56) References Cited

U.S. PATENT DOCUMENTS

| 6,073,201 | A | 6/2000 | Jolley et al. |
| 6,446,049 | B1* | 9/2002 | Janning et al. ................. 705/40 |
| 7,126,345 | B2* | 10/2006 | Seidel ........................... 324/601 |
| 2003/0225317 | A1 | 12/2003 | Schell |
| 2008/0007123 | A1* | 1/2008 | Klostermeier et al. ....... 307/135 |
| 2012/0330481 | A1* | 12/2012 | Feldkamp et al. ................ 701/2 |

OTHER PUBLICATIONS

Search Report issued in Int'l Appl. No. PCT/EP2011/072547 (2012).

* cited by examiner

*Primary Examiner* — Dinh Le
(74) *Attorney, Agent, or Firm* — Knobbe, Martens, Olson & Bear, LLP

(57) ABSTRACT

The input interface for a transmit/receive radio station includes an input for receiving a signal either with a variable voltage over a pre-determined voltage range, or an open collector signal having a voltage (0V) corresponding to the low logic state; a first output for the variable voltage signal, and a second open collector output. The first and second outputs are connected to the same input and the input is connected to a reference potential through a first voltage divider bridge, the middle point of which is connected to the positive terminal of an open loop comparator, the output of which is connected to the second output.

8 Claims, 2 Drawing Sheets

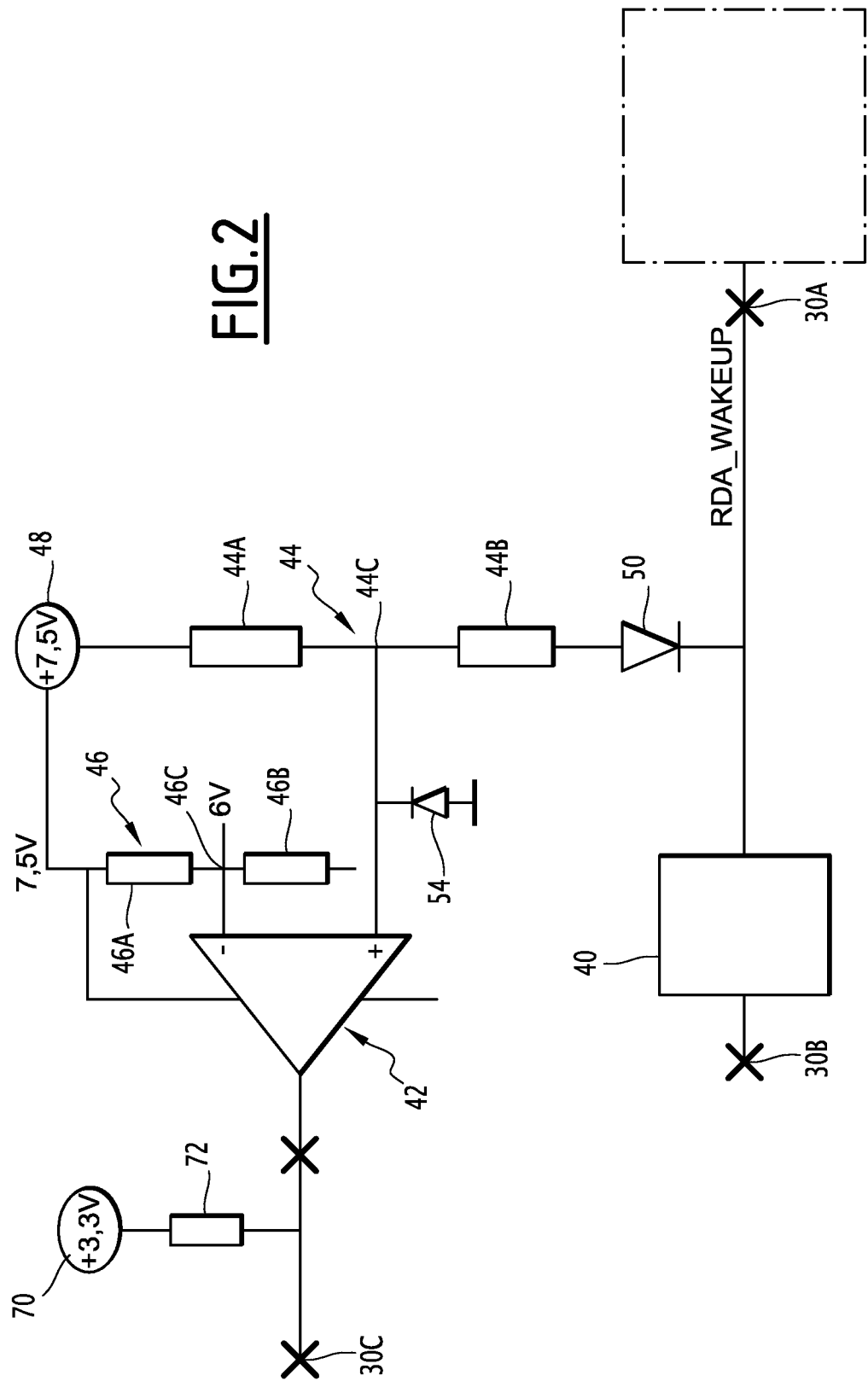

INPUT INTERFACE FOR A TRANSMIT/RECEIVE STATION AND STATION COMPRISING SAME

Figure 1:
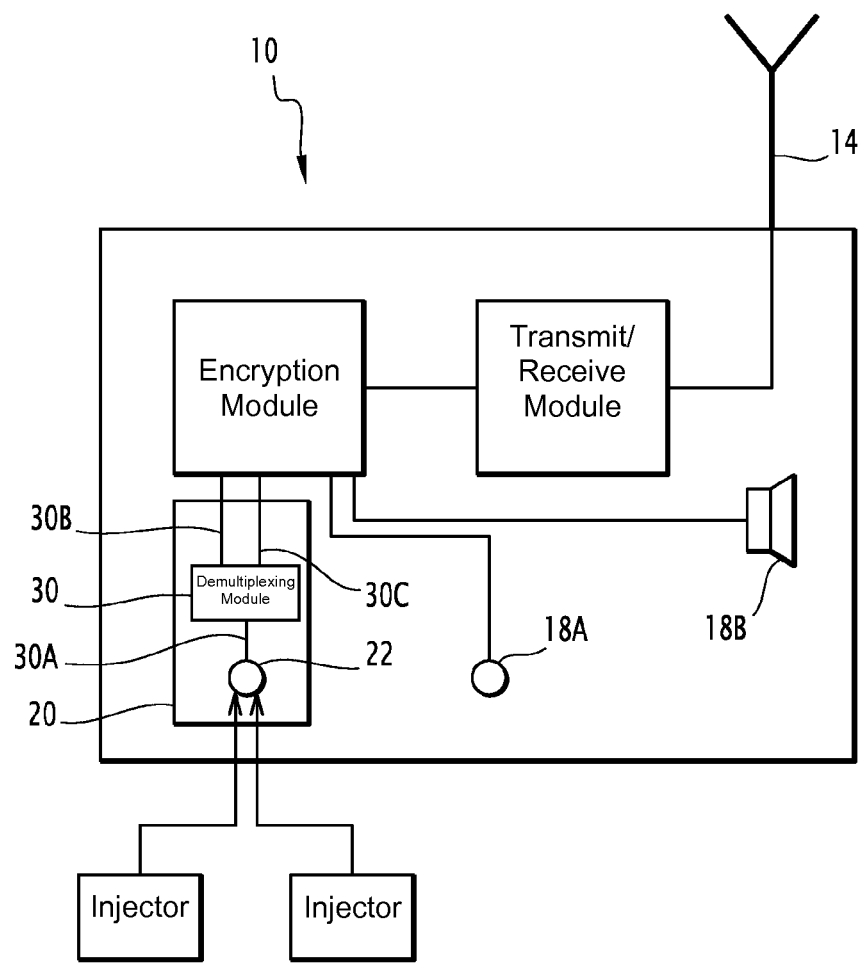

This application is a U.S. nationalization under 35 U.S.C. §371 of copending International Application No. PCT/EP2011/072547, filed Dec. 13, 2011, which claims priority to French Patent Application No. 1004845, filed Dec. 13, 2010. The disclosures set forth in the referenced applications are incorporated herein by reference in their entireties.

The present invention relates to an input interface for a radio transmit/receive station including:
- an input for receiving a signal either with a variable voltage over a predetermined voltage range, or an open collector signal having a voltage corresponding to the low logic state;
- a first output for the variable voltage signal;
- a second open collector output.

High frequency tactical transmit/receive stations are notably used during military operations for ensuring communications between the different forces engaged in the field. These stations ensure encrypted transmission of audio messages or data. They require several connectors placed on their front face in order to ensure the connection of auxiliary equipment and notably connection of means for injecting encryption keys in order to allow encryption/decryption by the station of the received or transmitted messages.

According to the techniques and standards used for injecting encryption keys, the key injection means provide the tactical station with signals of different voltage characteristics and require in the station, input interfaces matched to the output impedances of the injection means.

Thus, presently known tactical stations only allow the use of certain injector types, or require a presence on their front face of several types of connectors, each adapted to a particular code injector type.

The problem with these technical stations is that they do not allow the use of certain key injectors, or they are complex because of the multiplication of the input connectors.

The object of the invention is to propose a high frequency transmit/receive station allowing the use of several auxiliary devices providing signals with different characteristics and requiring different input impedances without multiplying the number of specific connectors.

For this purpose, the object of the invention is an input interface of a transmit/receive radio station of the aforementioned type, characterized in that the first and second outputs are connected to the same input and in that the input is connected to a reference voltage through a first voltage divider bridge, the middle point of which is connected to the positive terminal of an open loop comparator, the output of which is connected to the second output.

According to particular embodiments, the interface includes one or several of the following features:
- the first divider bridge is mounted in series with a diode preventing flow of the current into the divider bridge if the input voltage is greater than the reference voltage;
- the values of the resistances of the voltage divider bridge are such that for any value of the voltage of the signal applied on the input in the pre-determined voltage range, the voltage on the positive input of the comparator is positive;
- a protective diode is interposed between the positive input of the comparator and the ground;
- the negative input of the comparator is connected to a voltage, for which the value is comprised between the power supply voltage of the comparator and the voltage corresponding to the high logic state imposed on the input;
- the inverting input of the comparator is connected to the middle point of a voltage divider bridge connected to a reference potential;
- the comparator includes an open collector comparator without any feedback loop;
- the second output is connected to a reference potential through a pull-up resistor.

The object of the invention is also a radio station including a transmitting/receiving module, a processing circuit including two inputs and an input interface according to the invention, and the first and second outputs of which are connected to both inputs.

The invention will be better understood upon reading the description which follows, only given as an example and made with reference to the drawings wherein:

FIG. 1 is a schematic view of a tactical station according to the invention; and FIG. 2 is a view of the electric diagram of the input interface of the tactical station of FIG. 1.

The tactical station 10 illustrated in FIG. 1 is capable of ensuring transmission/receptions, notably encrypted transmission/receptions, to and from other tactical stations.

For this purpose, and as agreed per se, it includes a transmit/receive module 12, connected to an antenna 14. At the input of the transmit/receive module 12, it includes an encryption module 16 connected to an input 18A for information to be transmitted, to which a microphone or any data storage means may be connected such as a hard disk.

The encryption module is also connected to a module 18B for restoring decrypted data, such as a loudspeaker associated with an amplifier or a data storage unit.

Further, the station 10 includes an input interface 20 for receiving encryption keys from a removable key injector. This interface is connected to the encryption module 16.

The interface 20 includes a connector 22, notably with 14 pins. This connector is capable of receiving a first encryption key injector 26 capable of introducing into the tactical station a signal representative of the encryption key. The injector 26 is capable of being connected with an open collector.

The same connector 22 is able to be connected to a different encryption key injector 28 ensuring transmission, over the same pin of the connector as the injector 26 of a signal with the V28 standard (RS232).

The interface 20 includes, positioned between the connector 22 and the encryption module 16, a demultiplexing module 30 capable of receiving on an input 30A, a signal from a terminal of the connector 22 to which the code injector 26 or 28 is connected and of producing according to the type of signal received on either one of the two outputs 30B, 30C connected to the coding module 16, an encryption key either with the V28 standard or according to an open collector circuit.

The diagram of the demultiplexing circuit 30 is illustrated in FIG. 2, wherein the input 30A is again found, forming one of the pins of the connector 22 and both outputs 30B and 30C for a signal with the V28 standard and a so-called open collector signal, respectively.

The input 30A is connected through a driver circuit 40 to the RS232 standard directly at the output 30B. This circuit known per se is capable of processing and interpreting the received encryption keys.

Moreover, the input 30A is connected to the output 30C via an open loop and open collector comparator circuit 42 connected through its positive input to the middle point of a voltage divider bridge 44, its negative input being itself connected from the middle point of another voltage divider bridge 46.

The divider bridge 44 is formed with two resistors 44A and 44B connected in series from a voltage source 48 capable of imposing a positive potential, for example equal to 7.5 volts. The resistor 44B is connected to the input 30A of the circuit through a protective diode 50, the cathode of which is connected to the input 30A in order to only allow a flow of a current in the divider bridge 44 when the voltage at the input 30A is less than the voltage provided by the voltage source 48. This diode is a protection of a comparator for voltages at 30A which are greater than the voltage of the voltage source ensuring the power supply 48.

The middle point noted as 44C of the voltage divider bridge 44 is connected to the positive or non-inverting input of the comparator circuit 42. A protective diode 54 connects the same non-inverting input to the ground, the diode being orientated with its cathode connected to the non-inverting input.

The values of the resistors 44A and 44B are calculated so that the voltage applied to the positive terminal is zero and at the very least greater than −0.4 volts when the input voltage 30A is equal to the minimum voltage which may be applied to the input 30A taking into account the constraints of the V28 standard, i.e. −25 volts. For example, for a source voltage 48 equal to 7.5 volts, the resistor 44A has a value of 3 kΩ and the resistor 44B of 10 kΩ.

In this case, for zero voltage at the input 30A, the voltage on the positive or non-inverting input is 5.5V.

The negative or inverting input of the comparator circuit 42 is connected to the middle point noted as 46C of the voltage divider bridge 46, which is formed with two resistors in series 46A and 46B, one of the resistors of which is connected to the voltage source 48. The comparator circuit 42 is powered by the voltage source 48.

The comparator circuit 42 is for example a component with reference LM397 for which the voltage on the negative and positive input has to be maintained between −0.4V and 7.5V, with the penalty of destruction otherwise.

The values of the resistors 46A and 46B are selected so that the voltage at the non-inverting input is less than the power supply voltage of the operational amplifier and greater than the voltage present on the non-inverting terminal, as set by the divider bridge 44 when the input voltage 30A is set to zero volts by the key injector which is connected to it.

For example, the value of the resistor, 46A, is 2.5 kΩ when the value of the resistor 46B is 10 kΩ. In this case, the voltage at the inverting input is 6V.

The output of the comparator circuit 42 is connected to an auxiliary voltage source 70, for example of 3.3 volts, through a pull-up resistor 72, able to impose a voltage on the output 30C according to the levels of voltages supported by the components connected to the output 30C.

When a key injector 26 with an open collector is connected to the input 30A, the latter either provides a voltage of 0V corresponding to the low logic state, or a floating voltage different from 0V imposed by the interface 30 to which it is connected.

When the key injector 26 provides a voltage of 0V, the divider bridge 44, powered under a voltage of 7.5V by the generator 48 establishes a voltage of 5.5V on the positive input of the comparator 42. As this voltage is less than the 6V voltage applied on the inverting terminal of the comparator by the divider bridge 46, the comparator 42 produces at the output a zero voltage thus reproducing the signal at the input.

On the contrary, when the key injector 26 provides a non-zero voltage, the voltage at the input 30A is established to be 7.5V, this voltage being imposed by the single source 48. A voltage of 7.5V is also applied to the positive input of the comparator 42. This voltage being greater than the 6V voltage imposed at the negative input, the voltage on the output 30C is established to be 3.3V, this voltage being set by the voltage generator 70 because of the comparator 42 with an open collector output.

Alternatively, when the key injector is an injector 28 with the V28 format, the signal received at the input has a voltage either comprised between +3V and +25V, or between −3V and −25V.

This signal is directly delivered to the driver circuit 40 which ensures its processing.

When the voltage is −25V, the voltage applied on the positive terminal of a comparator 42 is zero by design of the voltage divider bridge 44. However, the diode 54 ensures flow of the current in the case when a negative voltage would be applied on the positive input of a comparator 42, thereby ensuring protection of the comparator 42.

For voltages comprised between −25V and 7.5V, the applied voltage on the non-inverting terminal varies from 0 to 7.5V, this voltage being compatible with the technical constraints imposed by the comparator 42.

For voltages comprises between +7.5V and +25V, the diode 50 ensures blocking of the voltage preventing the flow of any current in the voltage divider bridge 40, so that the voltage applied on the non-inverting terminal is +7.5V, which is compatible with the constraints for utilizing the comparator 42.

Thus, at no moment is the input of the comparator subject to a voltage of less than −0.4V or greater than 7.5V, thereby allowing its operation without any risk of destruction.

The proposed solution by using this interface allows the application of a single connector giving the possibility of connecting on a single input, either a key injector with an open collector output, or a key injector according to the V28 standard, without destroying a portion of the interface, even when voltages of high values are applied by the injector with the V28 standard.

The proposed solution only requires simple components in a small amount and may therefore be set up in a reduced space.

The invention claimed is:

1. A radio station a transmit/receive module, a processing circuit including a first and a second inputs and an input interface for the processing unit, the input interface including:
    an input for receiving a signal either with a variable voltage over a predetermined voltage range, or an open collector signal having a voltage (0V) corresponding to the low logic state;
    a first output for the variable voltage signal, connected to a first input of the processing unit;
    a second open collector output, connected to the second input of the processing unit;
    characterized in that the first and second outputs are connected to the same input and in that the input is connected to a reference potential through a first voltage divider bridge, the middle point of which is connected to the positive terminal of an open loop comparator, the output of which is connected to the second output.

2. The interface according to claim 1, further comprising the first divider bridge is mounted in series with a diode preventing the flow of the current in the divider bridge if the input voltage is greater than the reference voltage.

3. The interface according to claim 1, further comprising the values of the resistors of the voltage divider bridge are such that for any voltage value of the signal applied on the input in the pre-determined voltage range, the voltage on the positive input of the comparator is positive.

4. The interface according to claim 1, further comprising a protective diode is interposed between the positive input of the comparator and the ground.

5. The interface according to claim 1, characterized in that further comprising the negative input of the comparator is connected to a voltage, the value of which is comprised between the power supply voltage of the comparator and the voltage corresponding to the high logic state imposed on the input.

6. The interface according to claim 5, characterized in that further comprising the inverting input of the comparator is connected for the middle point of a voltage divider bridge connected to a reference potential.

7. The interface according to claim 1, fully comprising the comparator includes an open collector comparator without any feedback loop.

8. The interface according to claim 1, characterizing that further comprising the second output is connected to a reference potential through a pull-up resistor.

\* \* \* \* \*